United States Patent
Jeon et al.

(10) Patent No.: US 7,414,490 B2
(45) Date of Patent: Aug. 19, 2008

(54) DUAL-BAND VOLTAGE-CONTROLLED OSCILLATOR USING BIAS SWITCHING AND OUTPUT-BUFFER MULTIPLEXING

(75) Inventors: Sang-yoon Jeon, Seoul (KR); Heung-bae Lee, Suwon-si (KR); Seong-soo Lee, Suwon-si (KR); Jinup Lim, Seoul (KR); Joongho Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 94 days.

(21) Appl. No.: 11/288,212

(22) Filed: Nov. 29, 2005

(65) Prior Publication Data
US 2006/0170512 A1  Aug. 3, 2006

(30) Foreign Application Priority Data
Jan. 31, 2005  (KR) .................. 10-2005-0008613

(51) Int. Cl.
*H03B 5/12* (2006.01)
(52) U.S. Cl. .............. 331/179; 331/2; 331/46; 331/49; 331/56; 331/186
(58) Field of Classification Search .......... 331/186, 331/46, 56, 49, 2, 179
See application file for complete search history.

(56) References Cited

U.S. PATENT DOCUMENTS

| | | | | |
|---|---|---|---|---|
| 5,705,955 A | * | 1/1998 | Freeburg et al. | 331/14 |
| 5,982,242 A | * | 11/1999 | Jun et al. | 331/49 |
| 6,650,194 B1 | * | 11/2003 | Kertis et al. | 331/117 R |
| 6,876,263 B1 | * | 4/2005 | Li et al. | 331/49 |
| 7,116,180 B2 | * | 10/2006 | Hamaguchi et al. | 331/74 |
| 7,123,113 B1 | * | 10/2006 | Brennan et al. | 331/158 |
| 7,138,877 B2 | * | 11/2006 | Vu et al. | 331/2 |

* cited by examiner

*Primary Examiner*—Robert J. Pascal
*Assistant Examiner*—Levi Gannon
(74) *Attorney, Agent, or Firm*—Sughrue Mion, PLLC

(57) ABSTRACT

Disclosed is a dual-band voltage-controlled oscillator using bias switching and output-buffer multiplexing. The dual-band voltage-controlled oscillator includes a power supply unit for supplying a source voltage; plural voltage-controlled oscillation units for outputting different oscillation frequencies according to controls of a certain tuning voltage; plural bias units for generating driving voltages for driving the voltage-controlled oscillation units and supplying the driving voltages to the voltage-controlled oscillation units; and plural buffers for selectively outputting oscillation frequencies of the plural voltage-controlled oscillation units. The present invention implements the dual-band voltage-controlled oscillator through bias switching and output-buffer multiplexing, which brings an advantage of elimination of interference between output frequencies to enhance phase noise characteristics.

8 Claims, 5 Drawing Sheets

DUAL-BAND VOLTAGE-CONTROLLED OSCILLATOR USING BIAS SWITCHING AND OUTPUT-BUFFER MULTIPLEXING

CROSS-REFERENCE TO RELATED APPLICATIONS

This application claims benefit under 35 U.S.C. § 119 from Korean Patent Application No. 2005-08613, filed on Jan. 31, 2005, the entire contents of which are incorporated herein by reference.

BACKGROUND OF THE INVENTION

1. Field of the Invention

The present invention relates to a dual-band voltage-controlled oscillator, and more particularly to a dual-band voltage-controlled oscillator having less interference between oscillators and improved phase-noise characteristics by using bias switching and output-buffer multiplexing.

2. Description of the Related Art

As wireless communication services advance, next-generation wireless communication services such as wireless local loop (WLL) and International Mobile Telecommunications 2000 (IMT-2000) will be launched in the future together with the digital mobile phones and personal communication services (PCSs) in commercial services. The next-generation wireless communication services require diverse functions such as high-capacity data processing in image transmission systems.

The wireless communication services use different frequency bands. For example, a digital mobile phone uses the 800 MHz frequency band, a PCS uses the 1.9 GHz frequency band, IMT-2000 uses the frequency band of 1.8~2.1 GHz, and next-generation wireless communication services use the frequency band of 2.2 GHz.

The RF transmission/reception unit of the next-generation wireless communication system has a voltage-controlled oscillator providing radio frequencies (RF). The voltage-controlled oscillator refers to an oscillator having oscillation frequencies linearly changing according to input control voltages.

A conventional dual-band voltage-controlled oscillator will be described. FIG. 1A and FIG. 1B are views for showing a structure of a conventional dual-band voltage-controlled oscillator. First, FIG. 1A is a view for showing a structure of a dual-band voltage-controlled oscillator in which the common source terminal of a cross-coupled differential amplifier has a frequency two times as high as an output frequency. Such a dual-band voltage-controlled oscillator has a problem in that an output signal at the common source terminal (node A) has a small magnitude and poor phase noise characteristics due to interference between frequencies.

The dual-band voltage-controlled oscillator shown in FIG. 1B generates a frequency of 6 GHz and a frequency of 3 GHz obtained by dividing the frequency of 6 GHz in half by using the 6 GHz voltage-controlled oscillator. The above structure has a problem that its overall area is increased since additional circuits such as mixers and notch filters are required.

In addition, there is a method of obtaining a dual-band frequency by switching an array of inductors and capacitors of an LC tank. Such a method has difficulty in implementing resonant characteristics of the LC tank since values of the inductors and capacitors need to change in a wide range and MOS switches are added in order to obtain a frequency two times higher than an oscillation frequency. Further, the method has a problem of increased chip area due to the addition of inductors and capacitors.

SUMMARY OF THE INVENTION

The present invention has been developed in order to solve the above drawbacks and other problems associated with the conventional arrangement. An aspect of the present invention is to provide a dual-band oscillator integrated in high density into one chip through a CMOS process, and using bias switching and output-buffer multiplexing to reduce interference between the dual-band oscillators, thereby enhancing phase noise characteristics.

The foregoing and other objects and advantages are substantially realized by providing a dual-band voltage-controlled oscillator, comprising a power supply unit for supplying source voltages; plural voltage-controlled oscillation units for outputting different oscillation frequencies according to controls of a certain tuning voltage; plural bias units for generating driving voltages for driving the voltage-controlled oscillation units and supplying the driving voltages to the voltage-controlled oscillation units; and plural buffers for selectively outputting oscillation frequencies of the plural voltage-controlled oscillation units.

The plural voltage-controlled oscillation units may comprise a first voltage-controlled oscillation unit outputting an oscillation frequency of 2 GHz and a second voltage-controlled oscillation unit outputting an oscillation frequency of 5 GHz.

The predetermined tuning voltage may be a varactor tuning voltage supplied from a phase-locked loop.

The plural bias units may comprise a first bias unit for controlling driving of the first voltage-controlled oscillation unit and a second bias unit for controlling driving of the second voltage-controlled oscillation unit.

The first and second bias units may be turned on if a voltage of a first logic level is supplied from the power supply unit, and turned off if a voltage of a second logic level is applied from the power supply unit.

The plural buffers may comprise a first buffer turned on if a voltage of a first logic level is supplied from the power supply unit, and for selectively outputting an oscillation frequency of the first voltage-controlled oscillation unit; and a second buffer turned on if a voltage of a first logic level is supplied from the power supply unit, and for selectively outputting an oscillation frequency of the second voltage-controlled oscillation unit.

The second buffer may be turned off if the first buffer is turned on, and the first buffer may be turned off if the second buffer is turned on.

The power supply unit, plural voltage-controlled oscillation units, plural bias units, and plural buffers may be implemented on one chip through a CMOS process.

BRIEF DESCRIPTION OF THE DRAWINGS

The above aspects and features of the present invention will be more apparent by describing certain embodiments of the present invention with reference to the accompanying drawings, in which.

DETAILED DESCRIPTION OF EXEMPLARY EMBODIMENTS

Hereinafter, the present invention will be described with reference to the accompanying drawings.

Figure 1A:
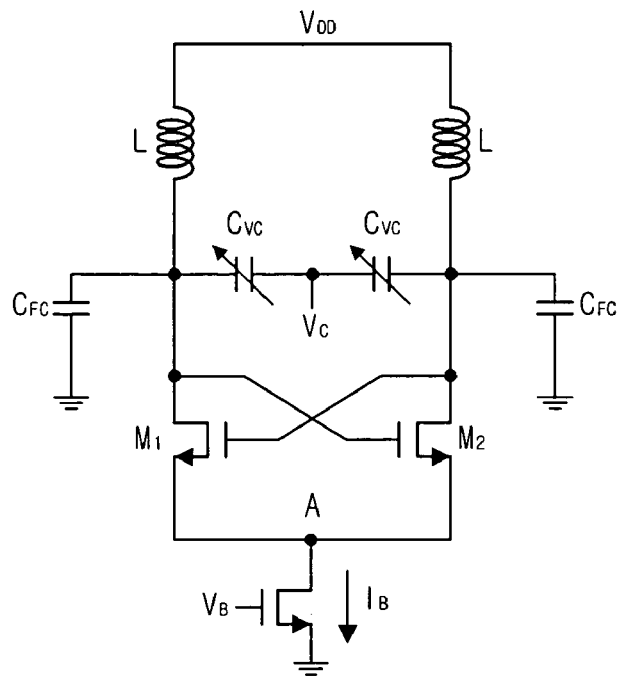
FIGS. 1A and 1B show conventional dual-band voltage-controlled oscillators.
Figure 1B:
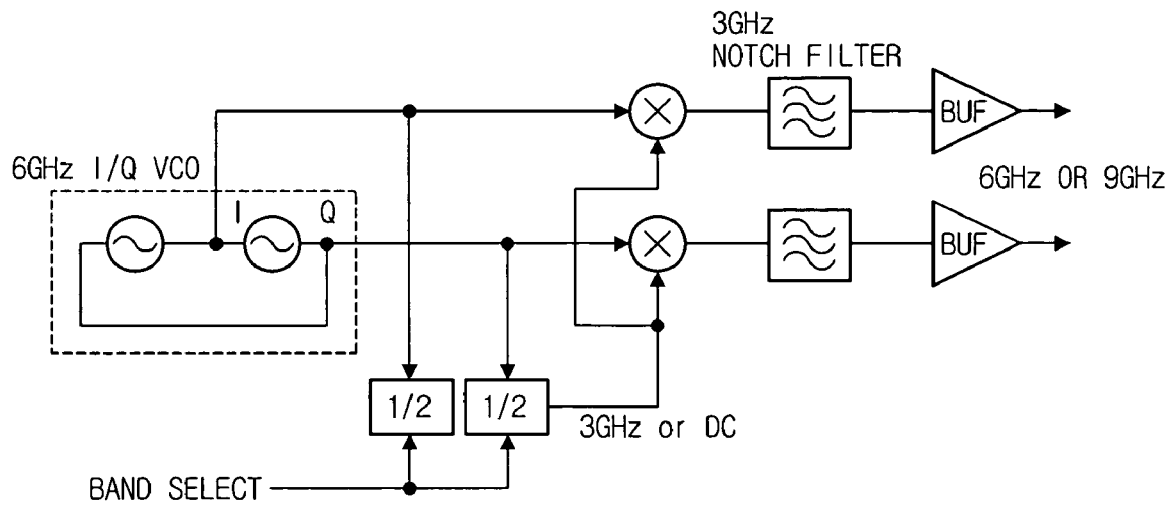
Figure 2:
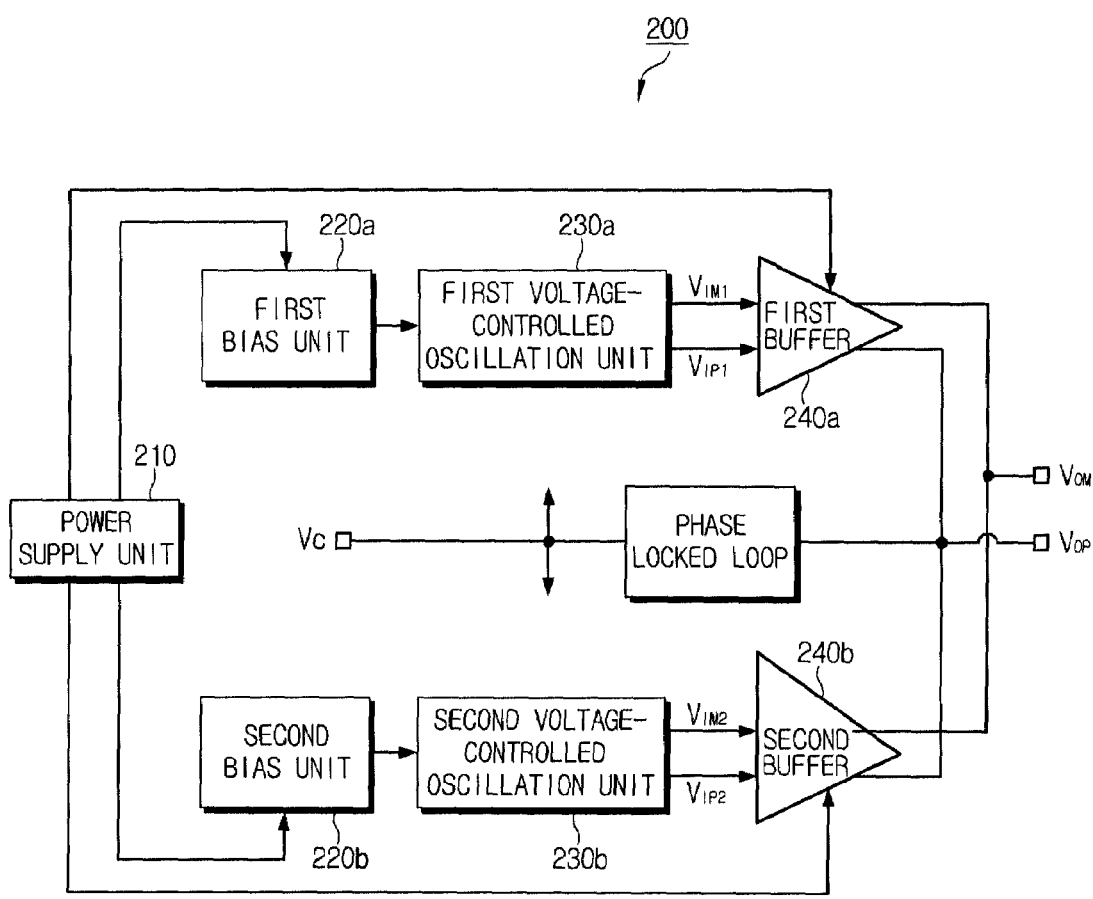
FIG. 2 is a view for showing a structure of a dual-band voltage-controlled oscillator using bias switching and output-buffer multiplexing according to an embodiment of the present invention.

FIG. 2 is a view for showing a structure of a dual-band voltage-controlled oscillator using bias switching and output-buffer multiplexing according to an embodiment of the present invention. In FIG. 2, the dual-band voltage-controlled oscillator 200 has a power supply unit 210, plural bias units including a first bias unit 220a and a second bias unit 220b, plural voltage-controlled oscillation units including a first voltage-controlled oscillation unit 230a and a second voltage-controlled oscillation unit 230b, and plural buffers including a first buffer 240a and a second buffer 240b.

The power supply unit 210 supplies a voltage of predetermined level to and drives the first and second bias units 220a and 220b and the first and second buffers 240a and 240b.

The plural bias units consist of the first bias unit 220a and the second bias unit 220b. If the power supply unit 210 supplies a high-level voltage to the first bias unit 220a, the first bias unit 220a supplies to the first voltage-controlled oscillation unit 230a a driving voltage for driving the first voltage-controlled oscillation unit 230a. Further, if the first bias unit 220a is supplied with a low-level voltage, the first bias unit 220a is turned off, and does not supply the driving voltage to the first voltage-controlled oscillation unit 230a.

The second bias unit 220b generally serves the same purpose as the first bias unit 220a. That is, if the second bias unit 220b is supplied with a high-level voltage, the second bias unit 220b supplies to the second voltage-controlled oscillation unit 230b a driving voltage for driving the second voltage-controlled oscillation unit 230b. Further, if the second bias unit 220b is supplied with a low-level voltage, the second bias unit 220b is turned off, and does not supply the driving voltage to the second voltage-controlled oscillation unit 230b.

The first and second voltage-controlled oscillators 230a and 230b generate different oscillation frequencies according to a varactor tuning voltage Vc supplied from a phase-locked loop (not shown). In the present embodiment, the first voltage-controlled oscillation unit 230a generates an oscillation frequency of 2 GHz as a center frequency, and the second voltage-controlled oscillation unit 230b generates an oscillation frequency of 5 GHz as a center frequency. However, the oscillation frequencies of the respective first and second voltage-controlled oscillation units 230a and 230b are not limited to the above.

The first and second buffers 240a and 240b selectively output the outputs of the first and second voltage-controlled oscillation units 230a and 230b. That is, if the power supply unit 210 supplies a high-level voltage-control to the first buffer 240a, the first buffer 240a is turned on, and outputs an oscillation frequency of the first voltage-controlled oscillation unit 230a. In the embodiment, the magnitude of the high-level voltage is about 1.8[V].

At this time, the second buffer 240b is supplied with a low-level voltage, so the second buffer 240b is turned off. In the embodiment, the magnitude of the low-level voltage is about 0[V]. That is, the plural buffers 240a and 240b selectively output the oscillation frequencies of the first and second voltage-controlled oscillation units 230a and 230b, respectively.

Figure 3:
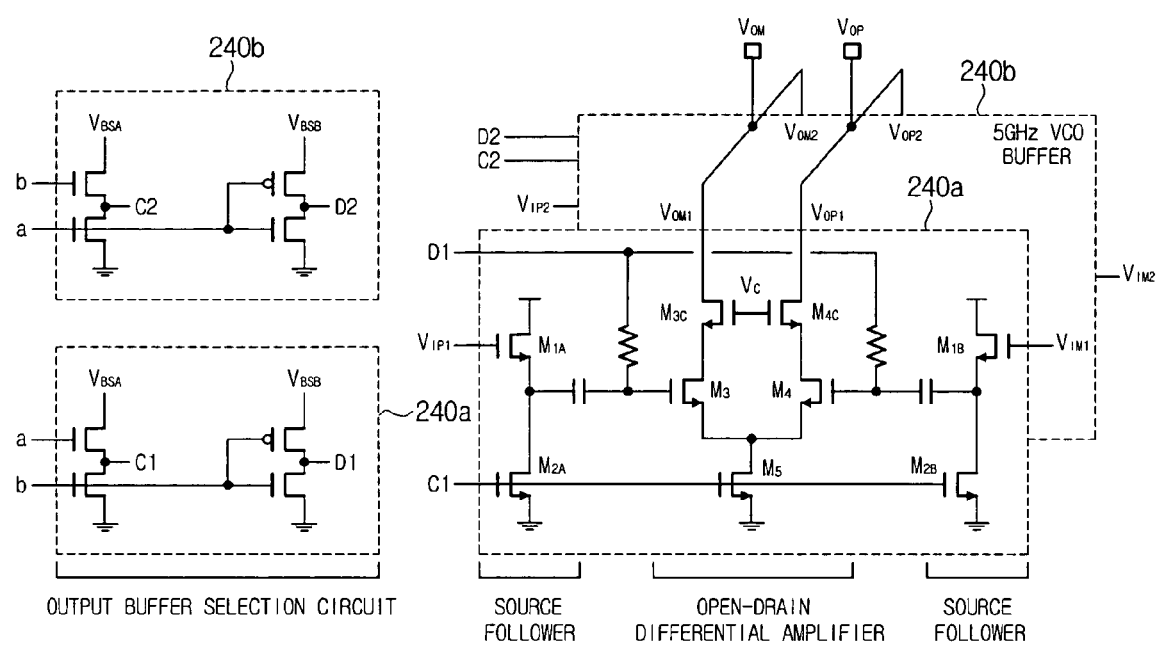
FIG. 3 is a view for showing the first and second buffers of FIG. 2 according to an embodiment of the present invention.

FIG. 3 is a block diagram for showing the first and second buffers of FIG. 2 according to an embodiment of the present invention. In FIG. 3, if the power supply unit 210 supplies a high-level voltage of 1.8[V] to the terminal a of the second buffer 240b, the terminal b of the same is grounded, that is, 0[V]. Therefore, the nodes C2 and D2 of the second buffer 240b are supplied with certain bias voltages, respectively. Thus, the second buffer 240b is turned on, and outputs an oscillation frequency of 5 GHz generated from the second voltage-controlled oscillation unit 230b. On the other hand, if the power supply unit 210 supplies a voltage of 1.8[V] to the terminal a of the first buffer 240a, the nodes C1 and D1 are grounded, that is, 0[V]. Thus, the first buffer 240a is turned off not to operate. In FIG. 3, reference numerals $V_{OM}$ and $V_{OP}$ denote the final outputs of the buffers, respectively, $V_{1M1}$ and $V_{1P1}$, the outputs of the first voltage-controlled oscillation unit 230a inputted to the first buffer 240a, respectively, and $V_{1M2}$ and $V_{1P2}$ the outputs of the second voltage-controlled oscillation unit 230b inputted to the second buffer 240b, respectively.

Table 1 shows tuning ranges and phase noise characteristics that are measured on the dual-band voltage-controlled oscillator according to an embodiment of the present invention.

TABLE 1

|  | first voltage-controlled oscillation unit | second voltage-controlled oscillation unit |
| --- | --- | --- |
| Center frequency | 2.004 GHz | 4.548 GHz |
| Phase noise | −115.2 dBc/Hz | −109 dBc/Hz |
| Tuning range | 229 MHz | 655 MHz |

In Table 1, the phase noise characteristics are the results measured at an offset frequency of 1 MHz.

Figure 4A:
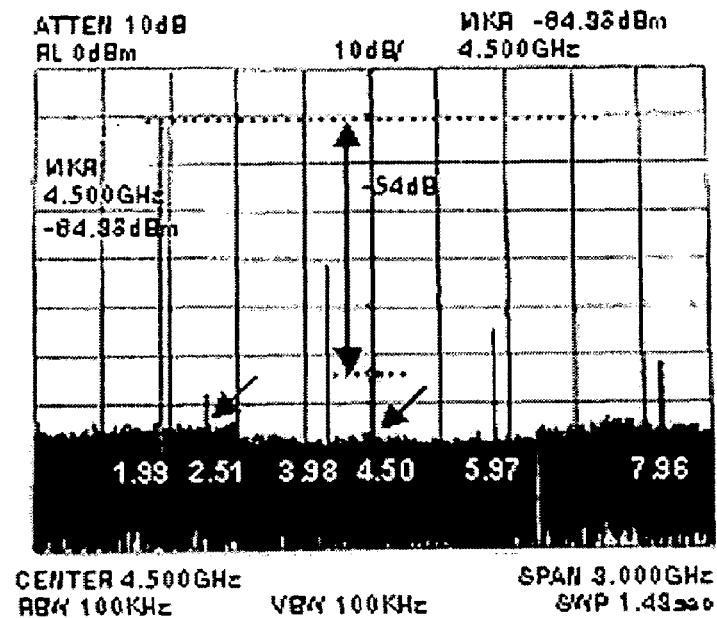
FIGS. 4A and 4B show results measured on the influence of a second voltage-controlled oscillator when an output of a first voltage-controlled oscillator of an exemplary embodiment is selected.
Figure 4B:
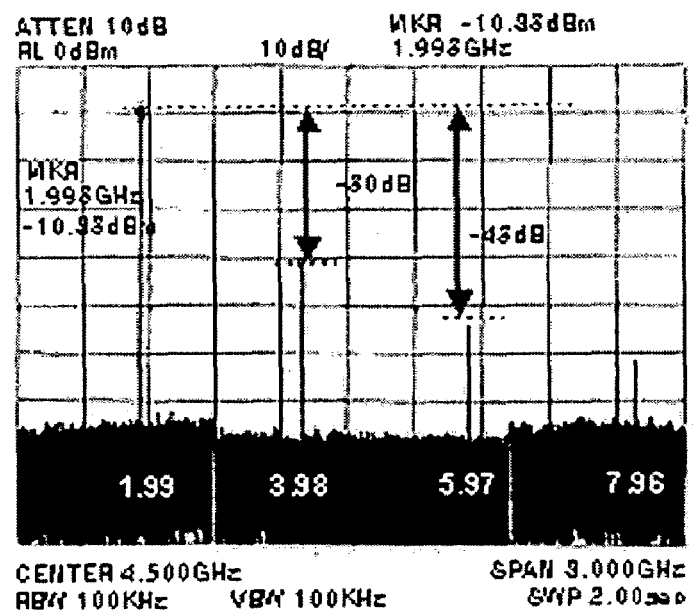

FIGS. 4A and 4B are views for showing results measured on the influence of the second voltage-controlled oscillation unit when an output of the first voltage-controlled oscillation unit is selected. FIG. 4A is a view for showing the output spectrum of the dual-band voltage-controlled oscillator when the second bias unit 220b is turned on and the second buffer 240b is turned off. FIG. 4A shows that, if the second voltage-controlled oscillation unit 230b operates when the second bias unit 220b is turned on and the second buffer 240b is turned off, there occurs the feedthrough of an oscillation frequency of the second voltage-controlled oscillation unit 230b through the turned-off second buffer 240b, causing a minute leakage of the frequency. Here, interference occurs between the outputs of the first and second voltage-controlled oscillation units 230a and 230b, which degrades the phase noise characteristics. FIG. 4B is a view for showing the output spectrum of the dual-band voltage-controlled oscillator when the second bias unit 220b is turned off and the second buffer 240b is turned off. FIG. 4B shows that, if the second bias unit 220b and the second buffer 240b are all turned off, no leakage frequency appears, so the phase noise characteristics are enhanced since interference between the oscillators can be eliminated.

Figure 5A:
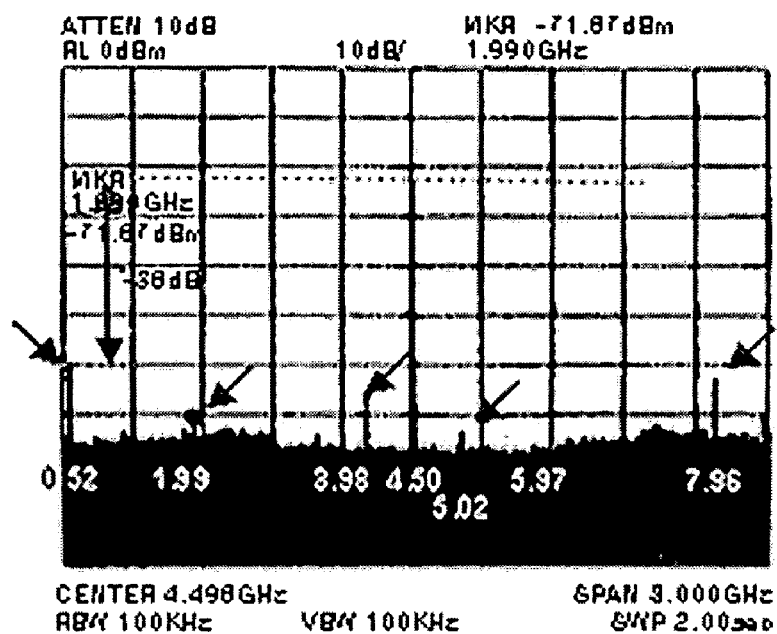
FIGS. 5A and 5B show the measurements of the influence of the first voltage-controlled oscillator when an output of the second voltage-controlled oscillator of an exemplary embodiment is selected.
Figure 5B:
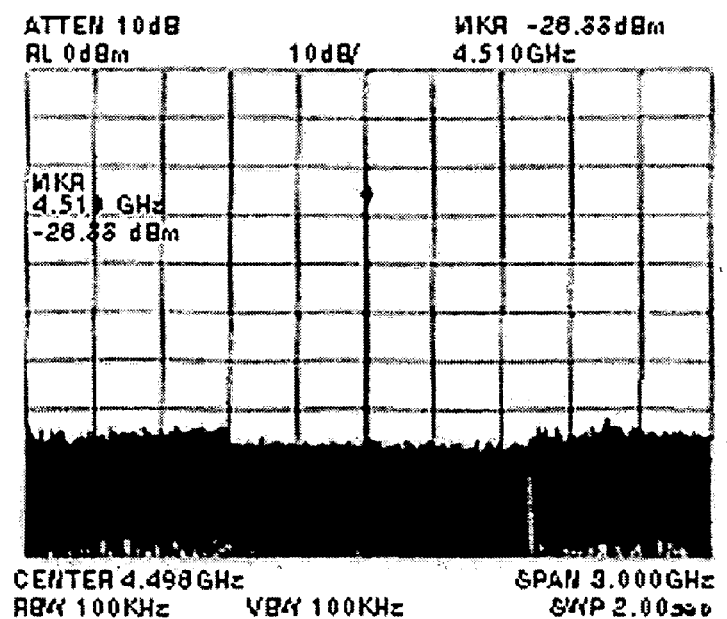

FIGS. 5A and 5B are views showing results measured on the influence of the first voltage-controlled oscillation unit when an output of the second voltage-controlled oscillation unit is selected. FIG. 5A is a view for showing the output spectrum of the dual-band voltage-controlled oscillator when the first bias unit 220a is turned on and the first buffer 240a is turned off, FIG. 5B is a view for showing the output spectrum of the dual-band voltage-controlled oscillator when the first bias unit 220a is turned off and the second buffer 240b is turned on.

As stated above, the present invention implements a dual-band voltage-controlled oscillator through bias switching and output-buffer multiplexing, which brings an advantage of elimination of interference between output frequencies to enhance phase noise characteristics.

Further, the present invention implements the dual-band oscillator in one chip through the CMOS process, which brings an advantage of reduction of the manufacturing cost due to high-density integration.

The foregoing embodiments and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A dual-band voltage-controlled oscillator, comprising:
   a power supply unit for supplying a source voltages;
   plural voltage-controlled oscillation units for outputting different oscillation frequencies according to controls of a certain tuning voltage;
   plural bias units for generating driving voltages for driving the voltage-controlled oscillation units and supplying the driving voltages to the voltage-controlled oscillation units; and
   plural buffers for selectively outputting oscillation frequencies of the plural voltage-controlled oscillation units,
   wherein the plural buffers are turned on and selectively output an oscillation frequency of a corresponding voltage-controlled oscillation unit if a voltage of a first logic level is supplied from the power supply unit.

2. The dual-band voltage-controlled oscillator as claimed in claim 1, wherein the plural voltage-controlled oscillation units comprise a first voltage-controlled oscillation unit outputting an oscillation frequency of 2 GHz and a second voltage-controlled oscillation unit outputting an oscillation frequency of 5 GHz.

3. The dual-band voltage-controlled oscillator as claimed in claim 2, wherein the plural buffers comprise:
   a first buffer turned on if a voltage of a first logic level is supplied from the power supply unit, and that selectively outputs an oscillation frequency of the first voltage-controlled oscillation unit; and
   a second buffer turned on if a voltage of the first logic level is supplied from the power supply unit, and that selectively outputs an oscillation frequency of the second voltage-controlled oscillation unit.

4. The dual-band voltage-controlled oscillator as claimed in claim 3, wherein the second buffer is turned off if the first buffer is turned on, and the first buffer is turned off if the second buffer is turned on.

5. The dual-band voltage-controlled oscillator as claimed in claim 1, wherein the predetermined tuning voltage is a varactor tuning voltage supplied from a phase-locked loop.

6. The dual-band voltage-controlled oscillator as claimed in claim 1, wherein the plural bias units comprise a first bias unit that controls driving of the first voltage-controlled oscillation unit and a second bias unit that controls driving of the second voltage-controlled oscillation unit.

7. The dual-band voltage-controlled oscillator as claimed in claim 6, wherein the first and second bias units are turned on if a voltage of a first logic level is supplied from the power supply unit, and turned off if a voltage of a second logic level is applied from the power supply unit.

8. The dual-band voltage-controlled oscillator as claimed in claim 1, wherein the power supply unit, plural voltage-controlled oscillation units, plural bias units, and plural buffers are implemented on one chip through a CMOS process.

* * * * *